Oct. 8, 1963 D. M. DANKO 3,106,647
BISTABLE SEMICONDUCTOR CIRCUIT RESPONSIVE TO SENSING DEVICE
Filed Feb. 19, 1960
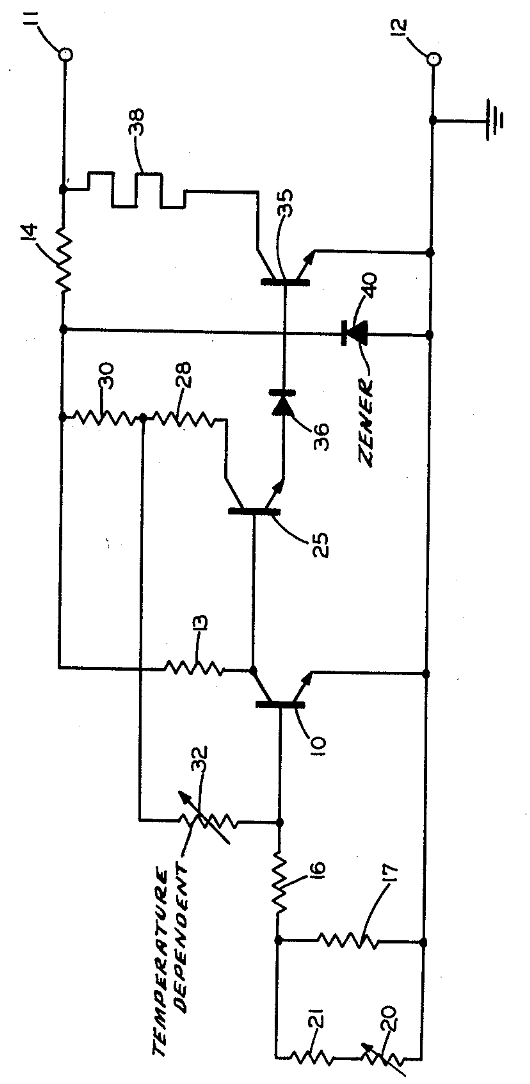
INVENTOR.
DONALD M. DANKO
BY Justin W. Macklin
ATTORNEY 3,106,647

BISTABLE SEMICONDUCTOR CIRCUIT RESPONSIVE TO SENSING DEVICE

Donald M. Danko, Parma, Ohio, assignor, by mesne assignments, to International Resistance Company, Philadelphia, Pa., a corporation of Delaware Filed Feb. 19, 1960, Ser. No. 9,769
5 Claims. (Cl. 307—88.5)

This invention relates to a bistable circuit, and, while it is of general application, it is particularly useful in providing a semiconductor circuit which can be used to effectuate the operation of a relay in response to a sensing device.

For example, in the copending application, Ser. No. 9,809, concurrently filed herewith, in the names of Ralph L. Blauvelt and Maurice F. Baddour, there is described a solid-state control circuit which utilizes a trigger device of the unijunction transistor type. The bistable circuit of the invention can be utilized to provide a control effect similar to that provided by the circuit of the above-mentioned copending application without the necessity of providing a device which is in itself inherently a trigger device.

There are many other applications where the bistable circuit of the invention can be utilized. However, it will be described in connection with a device for controlling the temperature of an oven within which is contained a quartz crystal, which must be maintained in its operation at a relatively constant temperature.

It is an object of the invention to provide an improved bistable transistor circuit.

It is a further object of the invention to provide a solid-state control circuit which is useful for applications where a trigger effect is required to actuate a control device such as a relay.

In accordance with the invention, a bistable circuit comprises a first transistor having a conductive state and a non-conductive state, and a second transistor having a conductive state and a non-conductive state. The second transistor is coupled to the first transistor so as to be in its non-conductive state when the first transistor is in its conductive state. A collector resistor is provided for the second transistor, together with means for biasing the first transistor through a portion of this collector resistor so that the first transistor is biased to its conductive state. Means are also provided, including the above-mentioned collector resistor, for feeding back energy from the second transistor to the first transistor in such a manner as to keep the first transistor in a non-conductive state in the absence of an external signal to the bistable circuit once said second transistor has been caused to go into its conductive state.

For a better understanding of the present invention, together with other and further objects thereof, reference is had to the following description taken in connection with the accompanying drawing, and its scope will be pointed out in the appended claims.

The single FIGURE of the drawing represents a solid-state control circuit which includes a bistable circuit in accordance with the present invention.

Referring now more particularly to the drawing, there is there shown a bistable circuit which includes a first transistor 10 which has a conductive state and a non-conductive state. The transistor 10 has its collector electrode connected to a terminal 11 through series-connected resistors 13 and 14, while its emitter electrode is connected directly to a terminal 12 which is preferably grounded. The base electrode of transistor 10 is connected to ground through series-connected resistors 16 and 17. A combination of series-connected resistors 20 and 21 is connected in parallel with the resistor 17.

A second transistor 25 is provided which has a non-conductive state and a conductive state in its normal operation. Transistor 25 is coupled to transistor 10 so as to be in its non-conductive state when transistor 10 is in its conductive state, and vice versa.

A collector resistor including series-connected resistors 28 and 30 is provided for transistor 25. The series combination of resistors 28 and 30 is connected between the collector electrode of transistor 25 and the common junction of resistors 13 and 14.

A variable resistor 32 is provided which is included in a means for biasing transistor 10 through a portion of the collector resistor 28, 30 of transistor 25 so that transistor 10 is normally biased to its conductive state.

Resistor 32 is also included in a means which includes the collector resistor 28, 30 of transistor 25 for feeding back energy from transistor 25 to transistor 10 which is sufficient to keep transistor 10 in a non-conductive state in the absence of an external signal to the bistable circuit once the second transistor 25 has been caused to go into its conductive state.

As mentioned above, the drawing illustrates that the bistable circuit of the invention is used to control a heater resistor which supplies heat to an oven adapted to be maintained at a relatively constant temperature. Thus, there is provided a power transistor 35 having its base electrode coupled to the emitter electrode of transistor 25 through a diode 36. A heater resistor 38 is provided between the collector electrode of transistor 35 and the terminal 11. The emitter electrode of transistor 35 is grounded. A voltage regulating zener 40 is connected between the common junction of resistors 13 and 14 and the terminal 12.

In considering the operation of the circuit which has just been described, it will be understood that the resistance values of the circuit are so chosen and the normal state of conductivity of transistor 10 is so adjusted, by means of variable resistor 20, that transistor 10 is in a state of relatively low conductivity but is adapted to be placed in a state of high conductivity by a relatively small variation of the voltage supplied to its base electrode. Under these conditions, it will be assumed that the value of resistor 32 decreases because the temperature within the oven within which it is contained as a temperature sensing element increases.

Under these conditions, there is a slight increase in the voltage applied to base electrode 10, and this transistor is operated to a state of relatively high conductivity. As soon as this occurs, the transistor 25 is caused to become relatively low in conduction. Upon the occurrence of a state of low conductivity in transistor 25, the power transistor 35 is de-energized through the diode 36 to reduce the current to the heater resistor 38. This state of affairs continues until the resistance of resistor 32 within the oven being controlled is increased to such a high value that transistor 10 is operated to its non-conductive state. Under these conditions, of course, transistor 25 is operated to its state of high conductivity, and this in turn has the effect of making transistor 35 fully conductive.

Referring once again to the condition under which transistor 25 is conductive, thereby causing power transistor 35 to be conductive, it will be seen that there is a positive feed back from the collector resistor 28, 30 of transistor 25 to the input circuit of transistor 10. The circuit is so adjusted that this feed back is just sufficient to maintain transistor 10 in its non-conductive state even though there is no external control signal applied to the circuit.

In the embodiment of the invention shown, it will be understood that the external control signal is provided by the resistance variations of resistor 32 and that this initially has the effect of causing transistor 10 to be non-conductive, thereby causing transistor 25 to be conductive.

The positive feed back just mentioned is sufficient that, even if this original control signal were immediately removed, the transistor 10 would be maintained in its non-conductive state and would thereby cause transistor 25 to remain in its conductive state.

Under these conditions, it will be seen that the bistable circuit of the drawing can be adjusted so that only a very small signal is effective to cause transistor 10 to assume its conductive state and so that the feed back provided by transistor 25 in response to this condition is such that transistor 10 is maintained in its conductive state, even though the effective input signal to transistor 10 is removed. The circuit is therefore preferably adjusted so that transistor 10 can be caused to become conductive with a very small input pulse which can thereafter be removed, and the feed back provided by transistor 25 will be just sufficient to cause transistor 10 to remain in its conductive state.

It will be seen therefore that very small signals can be used to trigger the bistable circuit of the invention. It will also be seen that a signal of very short duration can be used to trigger the bistable circuit of the invention. In other words, the circuit has two stable states in one of which transistor 10 is conductive and transistor 25 is non-conductive. In the other stable state, the transistor 10 is non-conductive and transistor 25 is conductive.

From what has been said, it will be seen that signals of very low amplitude or short duration can be utilized to change the circuit from one of its stable states to the other. It will also be apparent that the signals used to change from one stable state to the other can be applied with proper polarity to any appropriate place in the circuit. For example, in place of applying an input signal to transistor 10 to cause it to become non-conductive, a signal input could be supplied for transistor 25 which causes this transistor to be conductive and the effect is the same, i.e., the circuit is operated to its stable condition where transistor 10 is non-conductive and transistor 25 is conductive.

While applicant does not intend to be limited to any particular circuit values, there follows a list of circuit values which have been used in one embodiment of the invention for controlling the temperature of an oven utilized to maintain a quartz crystal at a relatively stable operating temperature:

| | |
|---|---|
| Transistors 10 and 25 | 2N333 |
| Transistor 35 | 2N497 |
| Diode 36 | SG22 |
| Diode 40 | 1N759A |
| Resistor 20 | GE D203 |
| Resistor 32 | GE R051 |
| Resistor 21 ohms | 20 |
| Resistor 16 | 1K |
| Resistor 17 ohms | 510 |
| Resistor 13 | 1.8K |
| Resistor 30 ohms | 220 |
| Resistor 28 | 2.7K |
| Resistor 14 | 1K |
| Resistor 38 ohms | 200 |

While there has been described what is at present considered to be the preferred embodiment of the invention, it will be obvious to those skilled in the art that various changes and modifications may be made herein without departing from the invention, and it is therefore intended in the appended claims to cover all such changes and modifications as fall within the true spirit and scope of the invention.

What I claim is:

1. A bistable circuit comprising: a first transistor having a conductive state and a non-conductive state; a second transistor having a conductive state and a non-conductive state and coupled to said first transistor so as to be in said non-conductive state when said first transistor is in its conductive state; a collector resistor for said second transistor; means for biasing said first transistor through a portion of said collector resistor so that said first transistor is normally biased to its conductive state; and means including said collector resistor for feeding back energy from said second transistor to said first transistor which is sufficient to keep said first transistor in a non-conductive state in the absence of an external signal to said bistable circuit once said second transistor has been caused to go into its conductive state.

2. A bistable circuit comprising: a first transistor having a conductive state and a non-conductive state; a second transistor having a conductive state and a non-conductive state and coupled to said first transistor so as to be in said non-conductive state when said first transistor is in its conductive state; a collector resistor for said second transistor; means for biasing said first transistor through a portion of said collector resistor so that said first transistor is normally biased to its conductive state; means including said collector resistor for feeding back energy from said second transistor to said first transistor which is sufficient to keep said first transistor in a non-conductive state in the absence of an external signal to said bistable circuit once said second transistor has been caused to go into its conductive state; and a power transistor coupled to said second transistor for providing a control effect.

3. A bistable circuit comprising: a first transistor having a conductive state and a non-conductive state; a second transistor having an emitter electrode and having a conductive state and a non-conductive state and coupled to said first transistor so as to be in said non-conductive state when said first transistor is in its conductive state; a collector resistor for said second transistor; means for biasing said first transistor through a portion of said collector resistor so that said first transistor is normally based to its conductive state; means including said collector resistor for feeding back energy from said second transistor to said first transistor which is sufficient to keep said first transistor in a non-conductive state in the absence of an external signal to said bistable circuit once said second transistor has been caused to go into its conductive state; and a power transistor having base, collector and emitter electrodes; and means for coupling said emitter electrode of said second transistor to said base electrode of said power transistor through a semi-conductor diode to cause said power transistor to provide a control effect when said second transistor is operated to its conductive state.

4. A bistable circuit comprising: a first transistor having a conductive state and a non-conductive state; a second transistor having an emitter electrode and having a conductive state and a non-conductive state and coupled to said first transistor so as to be in said non-conductive state when said first transistor is in its conductive state; a collector resistor for said second transistor; means for biasing said first transistor through a portion of said collector resistor so that said first transistor is normally biased to its conductive state; means including said collector resistor for feeding back energy from said second transistor to said first transistor which is sufficient to keep said first transistor in a non-conductive state in the absence of an external signal to said bistable circuit once said second transistor has been caused to go into its conductive state; a power transistor having base, collector and emitter electrodes; means for coupling said emitter electrode of said second transistor to said base electrode of said power transistor through a semi-conductor diode to cause said power transistor to provide a control effect when said second transistor is operated to its conductive state; a sensing device; and means for utilizing said sensing device to control the state of conductivity of said first transistor.

5. A bistable circuit comprising: a first transistor having a conductive state and a non-conductive state; a second transistor having an emitter electrode and having a conductive state and a non-conductive state and coupled to said first transistor so as to be in said non-conductive state when said first transistor is in its conductive state; a collector resistor for said second transistor; means for biasing said first transistor through a portion of said collector resistor so that said first transistor is normally biased to its conductive state; means including said collector resistor for feeding back energy from said second transistor to said first transistor which is sufficient to keep said first transistor in a non-conductive state in the absence of an external signal to said bistable circuit once said second transistor has been caused to go into its conductive state; a power transistor having base, collector and emitter electrodes; means for coupling said emitter electrode of said second transistor to said base electrode of said power transistor through a semiconductor diode to cause said power transistor to provide a control effect when said second transistor is operated to its conductive state; and a sensing device in the base emitter circuit of said first transistor for controlling the state of conductivity of said first transistor.

References Cited in the file of this patent

UNITED STATES PATENTS

| | | |
|---|---|---|
| 2,787,727 | Maure | Apr. 2, 1957 |
| 2,806,153 | Walker | Sept. 10, 1957 |
| 2,828,450 | Pinckaers | Mar. 25, 1958 |
| 2,884,518 | O'Neill | Apr. 28, 1959 |
| 2,887,542 | Blair | May 19, 1959 |